United States Patent
Han et al.

(10) Patent No.: US 11,042,243 B2
(45) Date of Patent: Jun. 22, 2021

(54) META PROJECTOR AND ELECTRONIC APPARATUS INCLUDING THE SAME

(71) Applicant: Samsung Electronics Co., Ltd., Suwon-si (KR)

(72) Inventors: Seunghoon Han, Seoul (KR); Byunghoon Na, Suwon-si (KR); Jangwoo You, Seoul (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 72 days.

(21) Appl. No.: 15/991,005

(22) Filed: May 29, 2018

(65) Prior Publication Data
US 2019/0034035 A1  Jan. 31, 2019

(30) Foreign Application Priority Data
Jul. 31, 2017  (KR) .......................... 10-2017-0097134

(51) Int. Cl.
*G06F 3/042* (2006.01)
*H01S 5/026* (2006.01)
(Continued)

(52) U.S. Cl.
CPC ............. *G06F 3/0426* (2013.01); *G01B 9/08* (2013.01); *G01B 11/22* (2013.01); *G01B 11/25* (2013.01);
(Continued)

(58) Field of Classification Search
CPC ...... G02B 1/118; G02B 5/1809; G02B 1/002; G02B 27/0944; G02B 27/20;
(Continued)

(56) References Cited

U.S. PATENT DOCUMENTS

| 6,937,405 B2 | 8/2005 | Sugawara |
| 9,417,442 B1 | 8/2016 | Laine et al. |
| (Continued) | | |

FOREIGN PATENT DOCUMENTS

| CN | 1577235 A | 2/2005 |
| CN | 101819501 A | 9/2010 |
| (Continued) | | |

OTHER PUBLICATIONS

Communication dated Dec. 14, 2018 issued by the European Patent Office in counterpart European Patent Application No. 18176506.6.

*Primary Examiner* — Kenneth Bukowski
(74) *Attorney, Agent, or Firm* — Sughrue Mion, PLLC

(57) ABSTRACT

A meta projector includes an edge emitting device configured to emit light through a side surface thereof, a meta-structure layer spaced apart from the upper surface of the edge emitting device that includes a plurality of nanostructures having a sub-wavelength shape dimension smaller than a wavelength of the light emitted from the edge emitting device, and a path changing member configured to change a path of the light emitted from the edge emitting device so as to direct the path toward the meta-structure layer. The meta projector may thus be configured to emit a light pattern of structured light, based on directing the light emitted from the edge emitting device through the meta-structure layer, while having a relatively compact device size.

14 Claims, 13 Drawing Sheets

(51) Int. Cl.

| | |
|---|---|
| *G01B 9/08* | (2006.01) |
| *G01B 11/22* | (2006.01) |
| *G03B 21/00* | (2006.01) |
| *G03B 21/20* | (2006.01) |
| *G02B 1/00* | (2006.01) |
| *G02B 1/118* | (2015.01) |
| *G02B 27/20* | (2006.01) |
| *G01B 11/25* | (2006.01) |
| *H01S 5/12* | (2021.01) |
| *H01S 5/343* | (2006.01) |
| *H01S 5/30* | (2006.01) |
| *G02B 5/18* | (2006.01) |
| *G02B 27/09* | (2006.01) |

(52) U.S. Cl.
CPC ............... *G02B 1/002* (2013.01); *G02B 1/118* (2013.01); *G02B 27/20* (2013.01); *G03B 21/00* (2013.01); G03B 21/001 (2013.01); *G03B 21/2033* (2013.01); *G03B 21/2066* (2013.01); *H01S 5/026* (2013.01); G02B 5/1809 (2013.01); G02B 5/1871 (2013.01); G02B 27/0944 (2013.01); *H01S 5/12* (2013.01); *H01S 5/3013* (2013.01); *H01S 5/343* (2013.01)

(58) Field of Classification Search
CPC ...... G02B 5/1871; G01B 11/22; G01B 11/25; G01B 11/2513; G01B 9/08; G03B 21/00; G03B 21/001; G03B 21/2033; G03B 21/2066; G06F 1/1639; G06F 1/1673; G06F 3/0304; G06F 3/0426; G06F 3/04886; G06T 2207/10028; G06T 2207/10048; G06T 2207/20224; G06T 7/514; G06T 7/521; G06T 7/55; G06T 7/74; H01S 5/0071; H01S 5/02216; H01S 5/02276; H01S 5/02288; H01S 5/02296; H01S 5/026; H01S 5/12; H01S 5/3013; H01S 5/343; H04N 13/122; H04N 13/128; H04N 13/239; H04N 13/254; H04N 2013/0081; H04N 5/247
See application file for complete search history.

(56) References Cited

U.S. PATENT DOCUMENTS

| | | | |
|---|---|---|---|
| 2005/0012721 A1* | 1/2005 | Fong | G09G 3/002 345/170 |
| 2008/0291951 A1* | 11/2008 | Konttinen | G02B 5/1809 372/21 |
| 2014/0211215 A1 | 7/2014 | Pesach et al. | |
| 2015/0277137 A1 | 10/2015 | Aschwanden et al. | |
| 2015/0292709 A1 | 10/2015 | Petronius et al. | |
| 2016/0124295 A1 | 5/2016 | Montgomery | |
| 2016/0127714 A1* | 5/2016 | Hazeghi | G02B 27/0075 348/46 |
| 2016/0209680 A1 | 7/2016 | Chen et al. | |
| 2016/0259175 A1* | 9/2016 | Ellenbogen | G02B 27/4211 |
| 2018/0209616 A1* | 7/2018 | Lee | H01L 33/62 |
| 2019/0025408 A1 | 1/2019 | Hwang et al. | |
| 2019/0154877 A1* | 5/2019 | Capasso | G02B 3/02 |

FOREIGN PATENT DOCUMENTS

| | | |
|---|---|---|
| CN | 104570402 A | 4/2015 |
| CN | 105068363 * | 11/2015 |
| CN | 106842606 A | 6/2017 |
| CN | 106990660 A | 7/2017 |
| EP | 1 777 490 A2 | 4/2007 |
| EP | 2 918 968 A2 | 9/2015 |
| JP | 8-17721 A | 1/1996 |
| JP | 3784255 B2 | 6/2006 |
| KR | 10-2013-0105381 A | 9/2013 |
| KR | 2017-0016175 A | 2/2017 |
| WO | 2008/142210 A1 | 11/2008 |

\* cited by examiner

META PROJECTOR AND ELECTRONIC APPARATUS INCLUDING THE SAME

CROSS-REFERENCE TO RELATED APPLICATION

This application claims the benefit, under 35 U.S.C. § 119, of Korean Patent Application No. 10-2017-0097134, filed on Jul. 31, 2017, in the Korean Intellectual Property Office, the disclosure of which is incorporated herein in its entirety by reference.

BACKGROUND

1. Field

The present disclosure relates to a meta projector and an electronic apparatus including the meta projector.

2. Description of the Related Art

Recently, demand has gradually increased for small laser projectors for combination with various electronic apparatuses.

For example, ultra-small projectors may be used for augmented reality (AR), virtual reality (VR), and mixed reality (MR) implemented by mobile and wearable devices, and laser projectors may be used to form structured light in depth sensors used to accurately recognize three-dimensional shapes of objects such as humans or other things.

In general, lighting components for laser projection are fabricated using micro-optic technology, and a plurality of optical components are necessary to achieve desired performance. The volume occupied by such optical components is a factor affecting design precision and fabrication conditions.

SUMMARY

Provided are meta projectors having ultra-small size and configured to output light with desired performance (e.g., structured light having a particular pattern).

Provided are electronic apparatuses including one or more meta projectors.

Additional aspects will be set forth in part in the description which follows and, in part, will be apparent from the description, or may be learned by practice of the presented embodiments.

According to some example embodiments, a meta projector may include a substrate, an edge emitting device on the substrate, a meta-structure layer spaced apart from the upper surface of the edge emitting device, and a path changing member. The edge emitting device may include an upper surface extending parallel to the substrate and a side surface inclined relative to the upper surface, the edge emitting device configured to emit light through the side surface. The meta-structure layer may be spaced apart from the upper surface of the edge emitting device. The meta-structure layer may include a plurality of nanostructures having a sub-wavelength shape dimension, the sub-wavelength shape dimension smaller than a wavelength of the light emitted from the edge emitting device. The path changing member may be configured to change a path of the light emitted from the edge emitting device to direct the path toward the meta-structure layer.

The meta projector may further include a housing fixing the substrate, the meta-structure layer, and the path changing member, such that the meta projector is an integrated module.

The substrate may include a cathode and an anode respectively connected to two electrodes of the edge emitting device; and an insulating layer electrically isolating the cathode and the anode from each other.

The plurality of nanostructures may include a material having a refractive index higher than a refractive index of a separate material adjacent to the plurality of nanostructures.

The plurality of nanostructures may include a conductive material.

The plurality of nanostructures may be associated with a shape distribution that is a regular distribution or a random distribution, such that the plurality of nanostructures are configured to form structured light having a particular pattern based on receiving the light emitted from the edge emitting device.

The shape distribution of the plurality of nanostructures may be associated with deflecting and outputting the structured light in a particular direction.

A shape distribution of the plurality of nanostructures may be associated with different transmission phase distributions based on polarization of incident light.

Shapes of cross-sections of the plurality of nanostructures parallel to the upper surface of the edge emitting device may have asymmetry.

The plurality of nanostructures may be associated with an arrangement pitch which is equal to or less than one-half of the wavelength of the light emitted from the edge emitting device.

The meta-structure layer may further include a support layer supporting the plurality of nanostructures, and the plurality of nanostructures may include separate pluralities of nanostructures on opposite, respective sides of the support layer.

One plurality of nanostructures on one side of the opposite, respective sides of the support layer where the light emitted from the edge emitting device first arrives may be associated with a shape distribution associated with a transmission phase distribution that increases a divergence angle of incident light.

The path changing member may include a reflective surface configured to bend the path of the light emitted from the edge emitting device by a particular angle.

The reflective surface may include a curved surface configured to adjust a divergence angle of incident light.

The reflective surface may include a meta-surface, the meta-surface including a plurality of nanostructures, the plurality of nanostructures associated with a sub-wavelength shape dimension smaller than the wavelength of the light emitted from the edge emitting device.

A shape distribution of the plurality of nanostructures of the meta-surface may be associated with adjusting a divergence angle of incident light.

A shape distribution of the plurality of nanostructures of the meta-structure layer may be associated with forming structured light providing a keyboard image in which a set of character keys is arranged or an image including at least one icon.

A user interface device may include the meta projector and an imaging device configured to photograph an image formed by the meta projector.

An electronic apparatus may include the user interface device, a memory configured to store at least one program of instructions, and a processor configured to extract a user input signal from an image captured by the imaging device and execute the program of instructions according to the user input signal.

A depth recognition apparatus may include the meta projector configured to emit structured light toward an object, a sensor configured to receive the structured light reflected from the object, and a calculator configured to compare a pattern of the structured light emitted toward the object and a pattern of the structured light reflected from the object, and calculate a depth position of the object.

According to some example embodiments, a meta projector may include a substrate, an edge emitting device on the substrate, and a path changing member configured to change a path of the light emitted from the edge emitting device. The edge emitting device may include an upper surface extending parallel to the substrate and a side surface inclined relative to the upper surface, the edge emitting device configured to emit light through the side surface. The path changing member may include a reflective surface configured to bend the path of the light emitted from the edge emitting device by a particular angle, the reflective surface including a meta-surface, the meta-surface including a plurality of nanostructures, the plurality of nanostructures associated with a sub-wavelength shape dimension smaller than a wavelength of the light emitted from the edge emitting device.

The reflective surface may include a curved surface configured to adjust a divergence angle of incident light.

A shape distribution of the plurality of nanostructures of the meta-surface may be associated with adjusting a divergence angle of incident light.

A shape distribution of the plurality of nanostructures of the meta-surface may be associated with forming structured light providing a keyboard image in which a set of character keys is arranged or an image including at least one icon.

The substrate may include a cathode and an anode respectively connected to two electrodes of the edge emitting device; and an insulating layer electrically isolating the cathode and the anode from each other.

The plurality of nanostructures may include a material having a refractive index higher than a refractive index of a separate material adjacent to the plurality of nanostructures.

The plurality of nanostructures may include a conductive material.

According to some example embodiments, a meta projector may include a substrate, an edge emitting device on the substrate, and a plurality of nanostructures. The edge emitting device may include an upper surface extending parallel to the substrate and a side surface inclined relative to the upper surface, the edge emitting device configured to emit light through the side surface. The plurality of nanostructures may be configured to receive the light emitted from the edge emitting device and generate a structured light pattern based on receiving the light emitted from the edge emitting device, the plurality of nanostructures having a sub-wavelength shape dimension, the sub-wavelength shape dimension smaller than a wavelength of the light emitted from the edge emitting device.

The plurality of nanostructures may be included in a meta-structure layer spaced apart from the upper surface of the edge emitting device. The meta projector may further include a path changing member configured to change a path of the light emitted from the edge emitting device to direct the path toward the meta-structure layer.

The plurality of nanostructures may be included in a path changing member of the meta projector, the path changing member configured to change a path of the light emitted from the edge emitting device. The path changing member may include a reflective surface configured to bend the path of the light emitted from the edge emitting device by a particular angle. The reflective surface may include a meta-surface, the meta-surface including the plurality of nanostructures.

The reflective surface may include a curved surface configured to adjust a divergence angle of incident light.

A shape distribution of the plurality of nanostructures of the meta-surface may be associated with adjusting a divergence angle of incident light.

A shape distribution of the plurality of nanostructures of the meta-surface may be associated with forming structured light providing a keyboard image in which a set of character keys is arranged or an image including at least one icon.

The substrate may include a cathode and an anode respectively connected to two electrodes of the edge emitting device; and an insulating layer electrically isolating the cathode and the anode from each other.

The plurality of nanostructures may include a material having a refractive index higher than a refractive index of a separate material adjacent to the plurality of nanostructures.

The plurality of nanostructures may include a conductive material.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
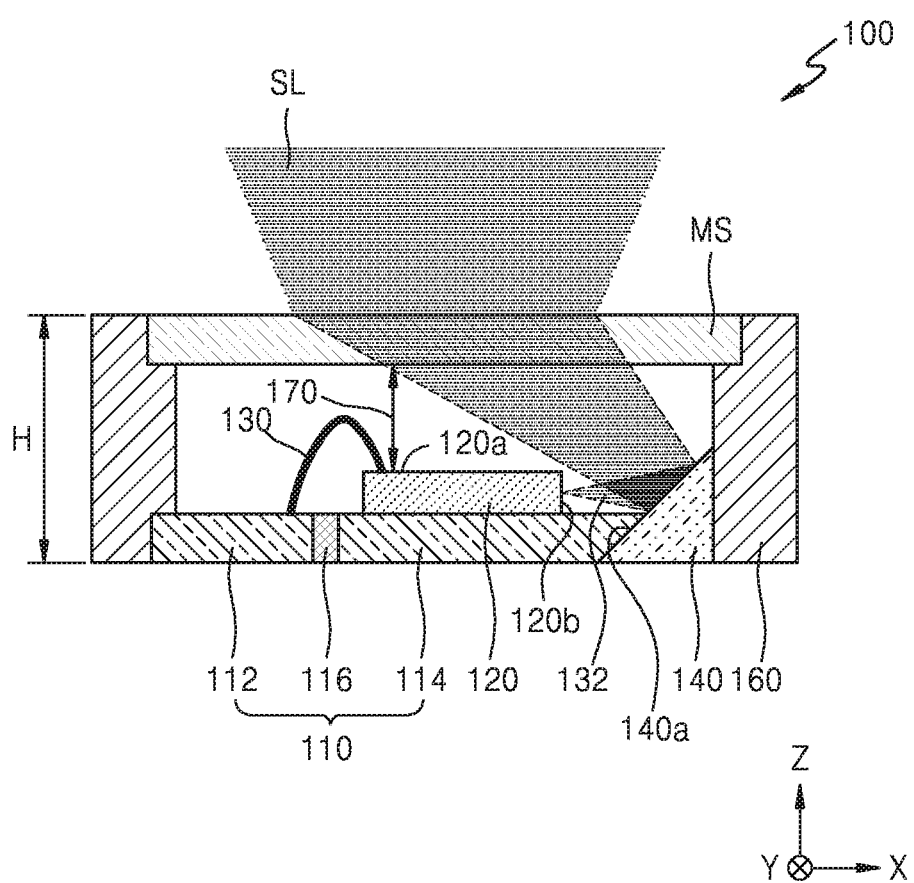
FIG. 1 is a cross-sectional view illustrating a schematic configuration of a meta projector according to some example embodiments.

Reference will now be made in detail to example embodiments, at least some of which are illustrated in the accompanying drawings, wherein like reference numerals refer to like elements throughout. In this regard, some example embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments of the present disclosure will be described with reference to the accompanying drawings. In the drawings, like reference numbers refer to like elements, and the sizes of elements may be exaggerated for clarity of illustration. The embodiments described herein are for illustrative purposes only, and various modifications may be made therefrom.

In the following description, when an element is referred to as being "above" or "on" another element, it may be directly on the other element while making contact with the other element or may be above the other element without making contact with the other element. Furthermore, when an element is referred to as being "on" another element, it will be understood that the element may be above or below the other element.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

As used herein, the singular forms "a," "an", and "the" are intended to include the plural forms as well, unless the context clearly indicates otherwise. It will be further understood that the terms "comprises" and/or "comprising" used herein specify the presence of stated features or elements, but do not preclude the presence or addition of one or more other features or elements.

In the present disclosure, terms such as unit or module are used to denote a unit having at least one function or operation and implemented with hardware, software, or a combination of hardware and software. Terms such as "unit" or "module" may further be used to denote an instance of hardware that is configured to perform the at least one function or operation.

Figure 2:
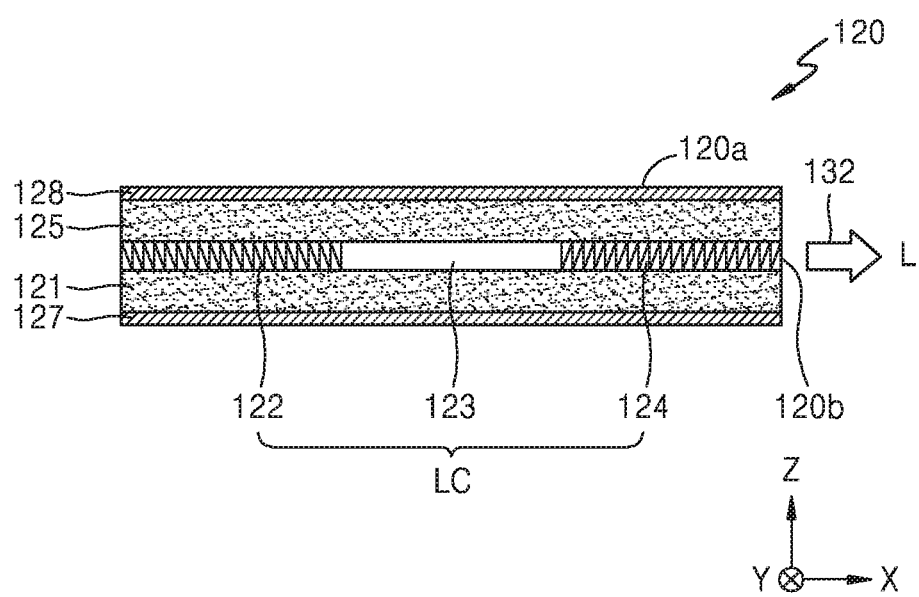
FIG. 2 is a cross-sectional view illustrating an example configuration of an edge emitting device included in the meta projector of FIG. 1.
Figure 3:
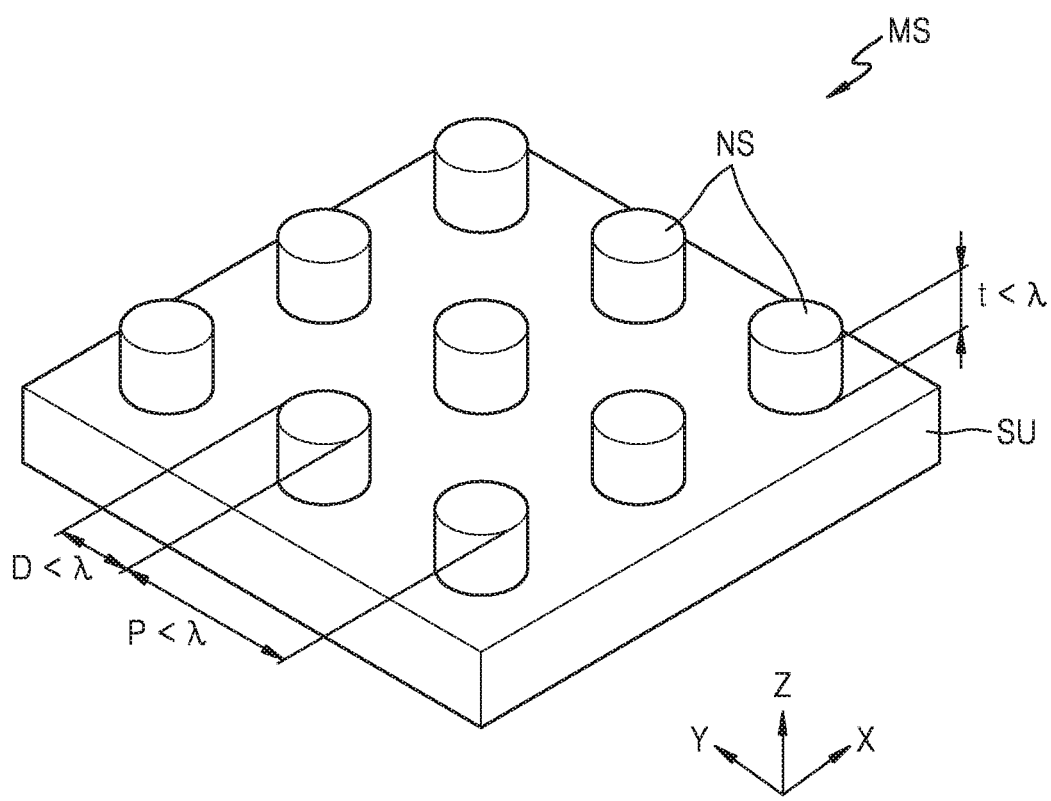
FIG. 3 is a perspective view illustrating an example configuration of a meta-structure layer that may be employed in the meta projector of FIG. 1.

FIG. 1 is a cross-sectional view illustrating a schematic configuration of a meta projector 100 according to some example embodiments. FIG. 2 is a cross-sectional view illustrating an example configuration of an edge emitting device 120 included in the meta projector 100 of FIG. 1. FIG. 3 is a perspective view illustrating an example configuration of a meta-structure layer MS that may be employed ("included") in the meta projector 100 of FIG. 1.

The meta projector 100 includes: the edge emitting device 120; the meta-structure layer MS spaced apart from the edge emitting device 120 and configured to convert light 132 emitted from the edge emitting device 120 into structured light SL having a particular (or, alternatively, predetermined) pattern and output the structured light SL; and a path changing member 140 configured to change a path of the light 132 emitted from the edge emitting device 120 to direct the path toward the meta-structure layer MS.

When light 132 generated by the edge emitting device 120 is incident on the meta-structure layer MS, the meta-structure layer MS forms a distribution of light rays propagating in space based on the incident light 132. Such light rays form a beam spot in an angular space and are variously distributed according to conditions applied to the meta-structure layer MS. These light lays are called structured light SL.

The structured light SL generated by the meta-structure layer MS may have a pattern mathematically coded to uniquely designate angular position coordinates using bright and dark points. Such a pattern may be changed in shape by a three-dimensional object, and this change may be imaged using an imaging device such as a camera so as to extract depth information about the three-dimensional object by comparing patterns and tracing the degree of variation in pattern shape according to coordinates.

The edge emitting device 120 may be placed ("located") on a substrate 110 and may include an upper surface 120a extending in parallel with the substrate 110 and a side surface 120b inclined relative to the upper surface 120a (e.g., side surface 120b may extend orthogonally relative to the upper surface 120a, as shown in FIG. 1). The side surface 120b is a light exit surface.

As shown in FIG. 1, the meta-structure MS is spaced apart from the upper surface 120a of the edge emitting device 120 according to spacing distance 170. As shown in FIG. 1, the meta structure MS may extend in parallel or substantially in parallel (e.g., parallel within manufacturing tolerances and/or material tolerances) to the upper surface 120a of the edge emitting device 120. Since the meta-structure layer MS is placed above the edge emitting device 120, and light 132 exits the edge emitting device 120 through the side surface 120b, a path changing member 140 is further provided between the edge emitting device 120 and the meta-structure layer MS, where the path changing member 140 is configured to change the path of light 132 exiting the edge emitting device 120 such that the path may be directed toward the meta-structure layer MS, as shown in FIG. 1. The path changing member 140 may include a reflective surface 140a which is configured to bend the propagation path of light 132 exiting the edge emitting device 120 by a particular (or, alternatively, predetermined) angle. For example, in the example embodiments shown in FIG. 1, the reflective surface 140a may be configured to bend the propagation path of light 132 by approximately 120 degrees. The reflective surface 140a may be mirror-coated. The inclination angle of the reflective surface 140a is associated with the position of the meta-structure layer MS relative to the side surface 120b which is a light exit surface of the edge emitting device 120, so that the reflective surface 140a is configured to bend the optical axis of light by a particular (or, alternatively, predetermined) angle. For example, the optical axis of light may be bent in a vertical direction or may be bent such that light may propagate in a direction inclined leftward by about 30°.

An example configuration of the edge emitting device 120 will now be described with reference to FIG. 2.

The edge emitting device 120 includes a lower clad layer 121 and an upper clad layer 125 spaced apart from each other. A gain region 123 is provided between the lower clad layer 121 and the upper clad layer 125. A first mirror region 122 and a second mirror region 124 are placed ("located") on both sides ("opposite sides") of the gain region 123. The first mirror region 122, the gain region 123, and the second mirror region 124 form ("at least partially comprise") a laser cavity LC.

The gain region 123 may include a material configured to generate light in a particular (or, alternatively, predetermined) wavelength band ("wavelength spectrum of light") when electrons and holes are injected through a first electrode 127 and a second electrode 128. The gain region 123 may have a group III-V compound semiconductor, or a quantum well or dot structure based on a group III-V compound semiconductor.

The lower clad layer 121 and the upper clad layer 125 may include a semiconductor material having a larger band gap than the gain region 123. For example, the lower clad layer 121 and the upper clad layer 125 may include GaAs, GaP, AlGaAs, InGaP, or InGaAlP.

The first electrode 127 may be provided on a lower surface of the lower clad layer 121, and the second electrode 128 may be provided on an upper surface of the upper clad layer 125, so as to inject current into the gain region 123. A contact layer (not shown) may be further provided between the lower clad layer 121 and the first electrode 127, and another contact layer (not shown) may be provided between the upper clad layer 125 and the second electrode 128. The contact layers may include GaAs, GaP, AlGaAs, InGaP, or InGaAs. The contact layers may be doped with an impurity to facilitate current injection into the gain region 123.

The first mirror region 122, the gain region 123, and the second mirror region 124 are arranged along in a horizontal direction, that is, in an X-axis direction as shown in FIG. 2. The first mirror region 122 and the second mirror region 124 reflect light generated in the gain region 123, and amplify light satisfying a particular (or, alternatively, predetermined) resonance condition and allow the amplified light to exit the edge emitting device 120 as light 132.

The first mirror region 122 and the second mirror region 124 may have a grating pattern configured to reflect light. The grating pattern has a horizontal repetition direction (the X-axis direction). Reflectivity may be adjusted according to the shape or repetition period of the grating pattern. In addition, the first mirror region 122 and the second mirror region 124 may be adjusted to have different reflectivities so as to control the direction in which light exits. For example, the first mirror region 122 may have a reflectivity of about 90% or greater, and the second mirror region 124 may have lower reflectivity than the first mirror region 122. In this case, light may exit to the side surface 120b through the second mirror region 124. However, this is a non-limiting example. In addition to the grating pattern, the first and second mirror regions 122 and 124 may employ ("include") various structures configured to perform a reflection function to form a resonator together with the gain region 123.

The edge emitting device 120 may further include: a semiconductor optical amplifier configured to further amplify light amplified while resonating in the laser cavity LC and exiting the edge emitting device 120; and a waveguide structure to guide light to a desired position.

In the above description, the basic configuration of the edge emitting device 120 is described, but the edge emitting device 120 is not limited thereto. The edge emitting device 120 may include a Fabry-Perot laser diode or a distributed feedback (DFB) laser diode. In addition, any structure having a lateral light exit surface may be employed.

The substrate 110 includes: a cathode 114 and an anode 112 respectively connected to the two electrodes 127 and 128 of the edge emitting device 120; and an insulating layer 116 electrically separating ("isolating," "insulating," etc.) the cathode 114 and the anode 112 from each other. The cathode 114 may be directly or indirectly in contact with the first electrode 127 provided on a lower surface of the edge emitting device 120, and the anode 112 may be connected through a wire 130 to the second electrode 128 provided on an upper surface of the edge emitting device 120.

The substrate 110 may also be configured to function as a heat sink discharging heat generated from the edge emitting device 120. That is, heat from the edge emitting device 120 may be discharged to the outside through the cathode 114 including a metallic material.

The meta projector 100 may be provided as an integrated module. That is, the substrate 110, the meta-structure layer MS, and the path changing member 140 may be provided as an integrated module. The meta projector 100 may further include a housing 160 configured to fix the substrate 110, the meta-structure layer MS, and the path changing member 140 Restated, the housing 160 may fix the substrate 110, the meta-structure layer MS, and the path changing member 140, such that the meta projector 100 is an integrated module. An "integrated module" will be understood to refer to a device that is an assembly of elements that are permanently coupled ("fixed") to each other, such that an interior of the assembly is sealed or substantially sealed (e.g., sealed within manufacturing tolerances and/or material tolerances) from external mechanical manipulation and the assembly may be referred to as a single, individual element.

The meta-structure layer MS includes a plurality of nanostructures NS having a sub-wavelength shape dimension that is smaller than the wavelength of light exiting the edge emitting device 120.

Referring to FIG. 3, a configuration of the meta-structure layer MS will be described.

The plurality of nanostructures NS included in the meta-structure layer MS have at least one sub-wavelength shape dimension that is smaller than the wavelength $\lambda$ of light 132 emitted from the edge emitting device 120. Here, the 'shape dimension' means a numerical value of a dimension including a thickness or cross-sectional width defining the shape of the nanostructures NS.

The thicknesses (t) of the nanostructures NS are smaller than the wavelength $\lambda$ of light 132 emitted from the edge emitting device 120. In addition, the arrangement pitch P of the nanostructures NS is smaller than the wavelength $\lambda$.

In some example embodiments, the shape dimension and/or the arrangement pitch P of the nanostructures NS may be equal to or less than one-half of the wavelength $\lambda$ of light emitted from the edge emitting device 120. The nanostructures NS may be configured to operate as a strong scattering unit forming a meta-structure. As the arrangement pitch P becomes smaller than the wavelength $\lambda$, incident light 132 on the nanostructures NS may be controlled to have a desired shape without high order diffraction, based on the at least one sub-wavelength shape dimension of the plurality of nanostructures NS.

Although the nanostructures NS are illustrated as having a cylindrical shape, the nanostructures NS are not limited thereto. Cross-sections of the nanostructures NS perpendicular to the thickness "t" direction of the nanostructures NS, that is, parallel with an XY plane, may have various shapes such as a polygonal shape, a cross shape, a star shape, or an asymmetric shape. In addition, although the nanostructures NS are illustrated as having the same shape ("a common shape"), the nanostructures NS are not limited thereto. For example, nanostructures NS having various shapes may be provided on the meta-structure layer MS.

The meta-structure layer MS may further include a support layer SU that supports the plurality of nanostructures NS. The support layer SU may include a dielectric material. For example, the support layer SU may include a polymer material such as polycarbonate (PC), polystyrene (PS), or polymethylmethacrylate (PMMA), or $SiO_2$.

The nanostructures NS may include a dielectric material. The nanostructures NS may include a material having a refractive index greater than the refractive index of a separate material that is adjacent to the plurality of nanostructures NS (e.g., a support layer SU). The nanostructures NS may include a material having a refractive index greater than the refractive index of the support layer SU. For example, the nanostructures NS may include any one of single crystal silicon, polycrystalline silicon (poly Si), amorphous silicon, $Si_3N_4$, GaP, TiO2, AlSb, AlAs, AlGaAs, AlGaInP, BP, and $ZnGeP_2$.

In some example embodiments, the plurality of nanostructures NS may include a conductive material. The conductive material may be a highly conductive metallic material configured to induce surface plasmon excitation. For example, the plurality of nanostructures NS may include at least any one selected from copper (Cu), aluminum (Al), nickel (Ni), iron (Fe), cobalt (Co), zinc (Zn), titanium (Ti), ruthenium (Ru), rhodium (Rh), palladium (Pd), platinum (Pt), silver (Ag), osmium (Os), iridium (Ir), gold (Au), and an alloy including any one of the listed elements. In addition, the nanostructures NS may include a highly conductive two-dimensional material such as graphene, or a conductive oxide.

In some example embodiments, some of the nanostructures NS may include a dielectric material having a high refractive index, and some of the nanostructures NS may include a conductive material. That is, some of the nanostructures NS may include a dielectric material having ("associated with") a refractive index greater than the refractive index of the substrate 110, and the other of the nanostructures NS may include a conductive material.

Each of the above-described nanostructures NS may be associated with a unique transmission intensity and transmission phase depending on the material and shape thereof. The phase or intensity distribution of light passing through the meta-structure layer MS may be controlled by adjusting the shape distribution of the nanostructures NS. Hereinafter, the term 'shape distribution' refers to at least any one of the shape of the plurality of nanostructures NS, the size of the plurality of nanostructures NS, the size distribution of the plurality of nanostructures NS, the arrangement pitch of the plurality of nanostructures NS, and the arrangement pitch distribution of the plurality of nanostructures NS. In some example embodiments, the plurality of nanostructures NS are associated with a particular shape distribution that is a regular distribution or a random distribution, such that the plurality of nanostructures are configured to form structured light SL having a particular pattern based on receiving the light 132 emitted from the edge emitting device 120. The shape distribution of the plurality of nanostructures NS may be associated with deflecting and outputting the structured light SL in a particular direction. In some example embodiments, a shape distribution of the plurality of nanostructures is associated with different transmission phase distributions based on polarization of incident light.

Although it is illustrated that all the nanostructures NS have the same shape, size and height, this is an example. That is, the nanostructures NS are not limited thereto. For example, the horizontal or vertical size or material of the nanostructures NS may be adjusted according to the positions of the nanostructures NS so as to cause the plurality of nanostructures NS to generate structured light SL having a particular transmission intensity distribution or a particular transmission phase distribution based on incident light 132 on the meta-structure layer MS, such that the plurality of nanostructures NS may be referred to as being "associated with" the particular transmission intensity distribution or the particular transmission phase distribution. In order to cause the plurality of nanostructures NS to generate structured light SL having a particular transmission intensity distribution or transmission phase distribution, the shape distribution of a group of a plurality of nanostructures NS may be determined according to the positions of the nanostructures NS. In addition, such groups of nanostructures NS may be repeatedly arranged at a particular (or, alternatively, predetermined) period. The shape distribution of the plurality of nanostructures NS may be regular, periodic, or pseudo-periodic. However, the shape distribution of the plurality of nanostructures NS is not limited thereto. For example, the shape distribution of the plurality of nanostructures NS may be random.

The meta-structure layer MS may have an ultra-small pitch and a thin thickness compared with micro-optical components of the related art, and thus may form an arbitrary pattern over a wide angular range without high order diffraction. Therefore, the meta projector 100 may have an ultra-small size (e.g., a relatively small size). For example, the thickness H of the meta projector 100 may be about 4 mm or less.

Restated, based on including a plurality of nanostructures NS as described herein, wherein the plurality of nanostructures NS have one or more physical distributions (e.g., shape distribution) as described herein such that the plurality of nanostructures NS are configured to generate structured light SL having a particular pattern based on light 132 emitted from the edge emitting device 120 being incident on the plurality of nanostructures NS, a meta projector may be configured to generate structured light SL having the particular pattern while retaining a relatively small ("compact") size. As a result, the meta projector may provide improved capital costs of manufacture for the meta projector and one or more devices that may incorporate the meta projector. The meta projector, by virtue of reduced cost and/or size, may be more economically and/or practically incorporated into electronic devices to enable the electronic devices to implement augmented reality (AR), virtual reality (VR), or mixed reality (MR). In addition, the meta projector may be used as a light source to form structured light in depth sensors used for accurate three-dimensional shape recognition. As a result, based on including the plurality of nanostructures NS as described herein, a meta projector may address issues associated with practical and/or economic incorporation of projectors associated with user interfaces, augmented reality (AR), virtual reality (VR), or mixed reality (MR), some combination thereof, or the like into electronic devices.

Figure 4:
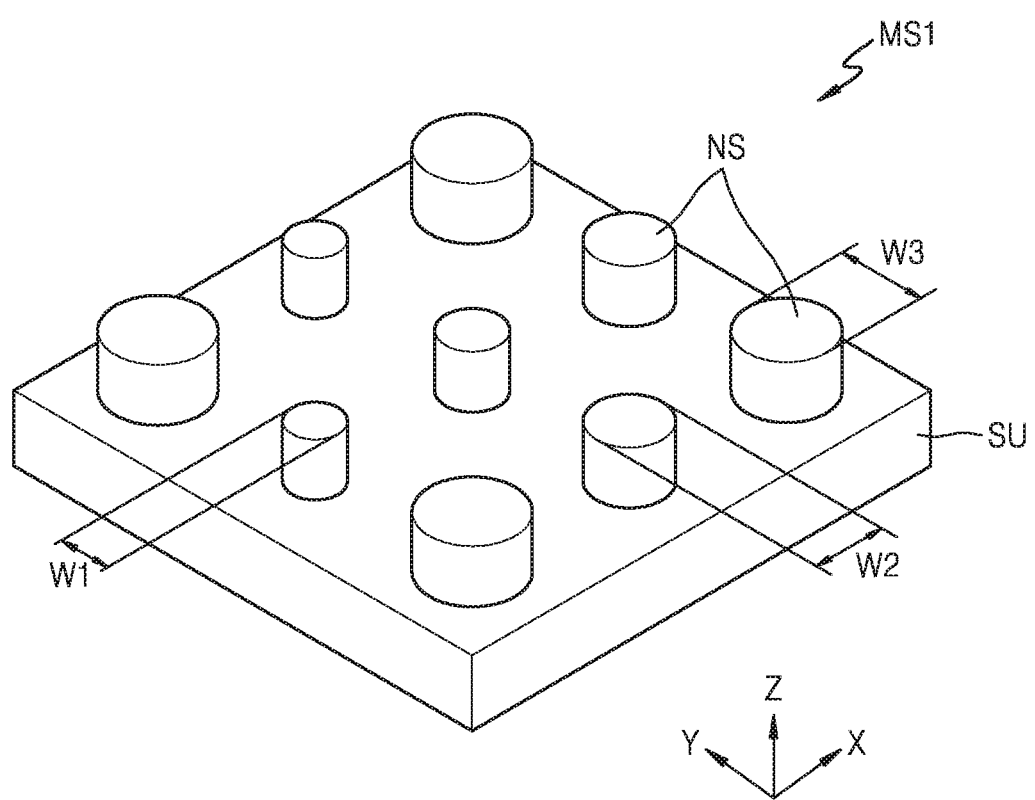
FIG. 4 is a perspective view illustrating an example configuration of another meta-structure layer that may be employed in the meta projector of FIG. 1.

FIG. 4 is a perspective view illustrating an example configuration of another meta-structure layer MS1 applicable to the meta projector 100 of FIG. 1.

A plurality of nanostructures NS provided on the meta-structure layer MS1 may have a random shape distribution in order to be configured to form a structured light SL having a particular pattern. FIG. 4 illustrates that the widths w1, w2, w3 of the nanostructures NS are different at different positions. However, this is a non-limiting example. For example, the arrangement positions and shapes of the nanostructures NS may also be random instead of being regular over positions.

FIGS. 5 to 8 are perspective views illustrating example shapes of nanostructures NS that may be applied to ("included in") the meta-structure layer MS of the meta projector 100 illustrated in FIG. 1.

Figure 5:
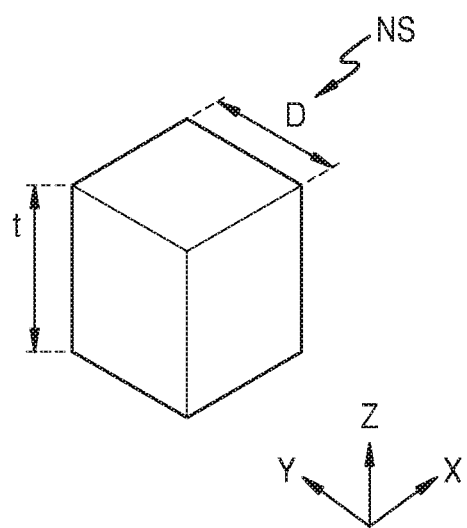
FIGS. 5 to 8 are perspective views illustrating example shapes of nanostructures applicable to the meta-structure layer of the meta projector of FIG. 1.

Referring to FIG. 5, a nanostructure NS may have a tetragonal pillar shape with a thickness (t). The cross-sectional shape of the tetragonal pillar may be a square shape having a length D on a side, but is not limited thereto. For example, the cross-sectional shape of the tetragonal pillar may be rectangular. The nanostructure NS may be modified to have another polygonal pillar shape.

Figure 6:
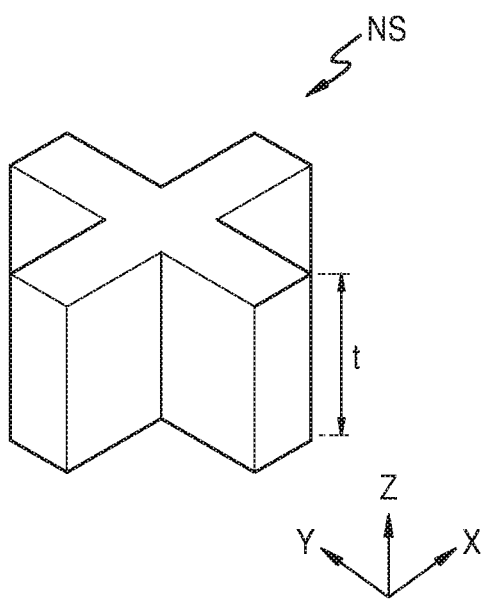

Referring to FIG. 6, the cross-sectional shape of a nanostructure NS may be a cross shape. Although it is illustrated that the nanostructure NS has a symmetric shape, this is an example. That is, the nanostructure NS may be modified to have an asymmetric shape. Restated, shapes of cross-sections of the plurality of nanostructures NS parallel to the upper surface 120a of the edge emitting device 120 may have asymmetry.

The nanostructure NS may have an asymmetric shape to form different transmission phase distributions depending on the polarization of incident light.

Figure 7:
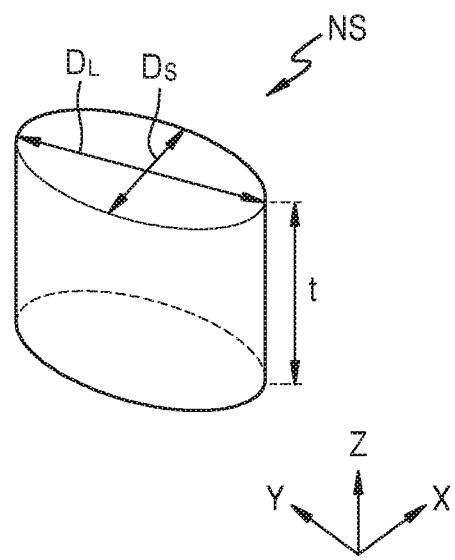

Referring to FIG. 7, a nanostructure NS may have an asymmetric elliptical pillar shape. The nanostructure NS may have an elliptical shape with a major-axis length $D_L$ being different from a minor-axis length $D_S$, and in this case, different transmission phase distributions may appear in polarized light parallel to the major axis and polarized light parallel to the minor axis. That is, different optical operations may be respectively performed on light polarized parallel to the major axis and light polarized parallel to the minor axis.

Figure 8:
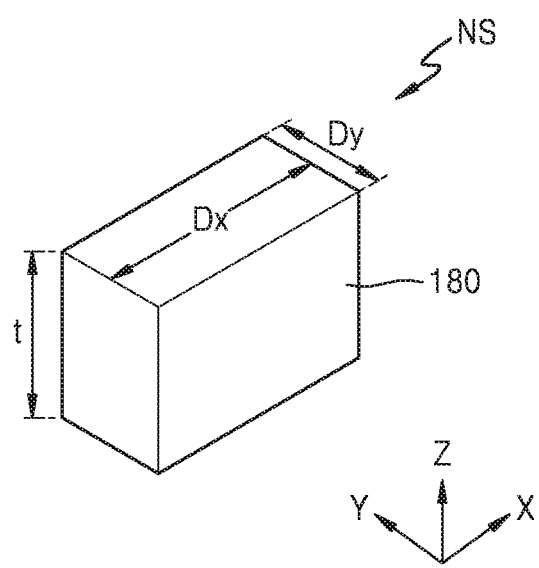

Referring to FIG. 8, a nanostructure NS may have an asymmetric rectangular parallelepiped shape having a rectangular cross-section with a length $D_x$ and a width $D_y$. Like the shape shown in FIG. 7, this shape may result in different transmission phase distributions depending on the polarization of incident light. For example, different optical effects may be obtained depending on the polarization of incident light.

The nanostructures NS having the shapes illustrated in FIGS. 5 to 8, combinations of the nanostructures NS, or modifications thereof may be applied to the meta-structure layer MS of the meta projector 100 shown in FIG. 1 in a regularly arranged form as shown in FIG. 3 or a randomly arranged form as shown in FIG. 4. The nanostructures NS of the Meta-structure layer MS may be adjusted in shape, size, and arrangement so as to convert light exiting the edge emitting device 120 into structured light having a pattern. In addition, the shape distribution of the nanostructures NS may be determined so as to adjust optical performance such as the beam diameter, converging/diverging, and direction of exiting light.

If asymmetric nanostructures NS are employed, the above-described optical operations may be performed on light having specific polarization directions distinguishable by asymmetry. For example, rules for arranging asymmetric nanostructures NS may be varied according to the direction of polarization, so as to obtain different structured light forms from light having different polarizations.

Figure 9:
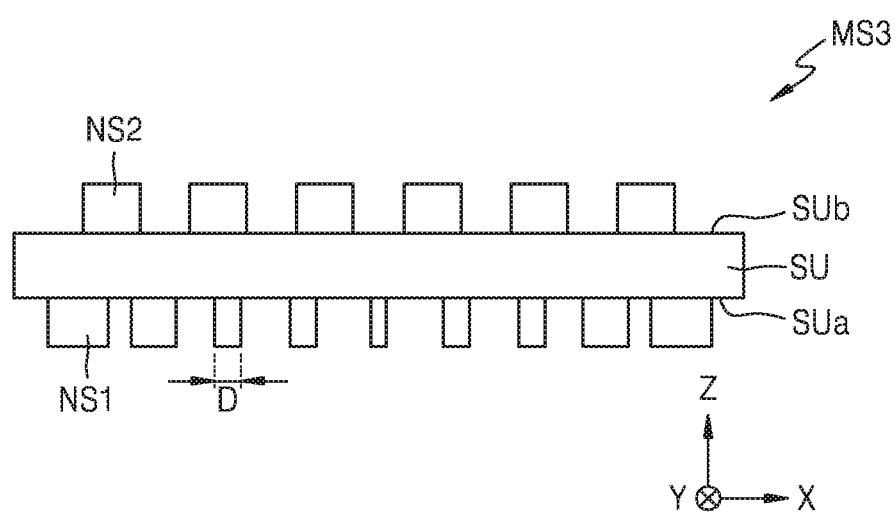
FIG. 9 is a perspective view illustrating an example configuration of another meta-structure layer applicable to the meta projector of FIG. 1.

FIG. 9 is a perspective view illustrating an example configuration of another meta-structure layer MS3 applicable to the meta projector 100 shown in FIG. 1.

The meta-structure layer MS3 may include a plurality of nanostructures NS on both sides of a support layer SU, where separate pluralities of nanostructures NS1 and NS2 are on opposite, respective sides of the support layer SU. As shown in FIG. 9, a plurality of nanostructures NS1 may be arranged on a lower surface SUa of the support layer SU to form a particular (or, alternatively, predetermined) shape distribution, and a plurality of nanostructures NS2 may be arranged on an upper surface SUb of the support layer SU to form another particular (or, alternatively, predetermined) shape distribution.

The lower surface SUa of the supporting layer SU may face the edge emitting device 120. That is, light 132 emitted from the edge emitting device 120 may first reach ("arrive at") the lower surface SUa. In this case, the plurality of nanostructures NS1 arranged on the lower surface SUa of the support layer SU may have a particular shape distribution such that the plurality of nanostructures NS1 are configured to increase the divergence angle of incident light. Restated, one plurality of nanostructures NS1 on one side of the opposite sides of the support layer SU where the light 132 emitted from the edge emitting device 120 first arrives may be associated with a shape distribution associated with a transmission phase distribution that increases a divergence angle of incident light 132. For example, the shape and transmission phase distribution of the plurality of nanostructures NS1 may cause the plurality of nanostructures NS1 to be configured to perform a function like a concave lens. To this end, the shape distribution of the plurality of nanostructures NS1 may be such that the widths of the plurality of nanostructures NS1 may gradually increase from a reference position in a radial direction. This rule may be repeatedly applied to radial directions, and the period of repetition may not be constant. In addition, the shape and transmission phase distribution of the nanostructures NS1 may be associated with the nanostructures NS1 being configured to perform a function like a concave lens having a cylindrical surface or an ellipsoidal surface.

The plurality of nanostructures NS2 formed on the upper surface SUb of the support layer SU may have a shape distribution such that the nanostructures NS2 are configured to convert light 132 having a divergence angle widened by the plurality of nanostructures NS1 into structured light SL having a particular (or, alternatively, predetermined) pattern.

The shapes of the nanostructures NS1 and NS2 may be selected from the shapes illustrated in FIGS. 5 to 8, combinations thereof, and modifications thereof.

Figure 10:
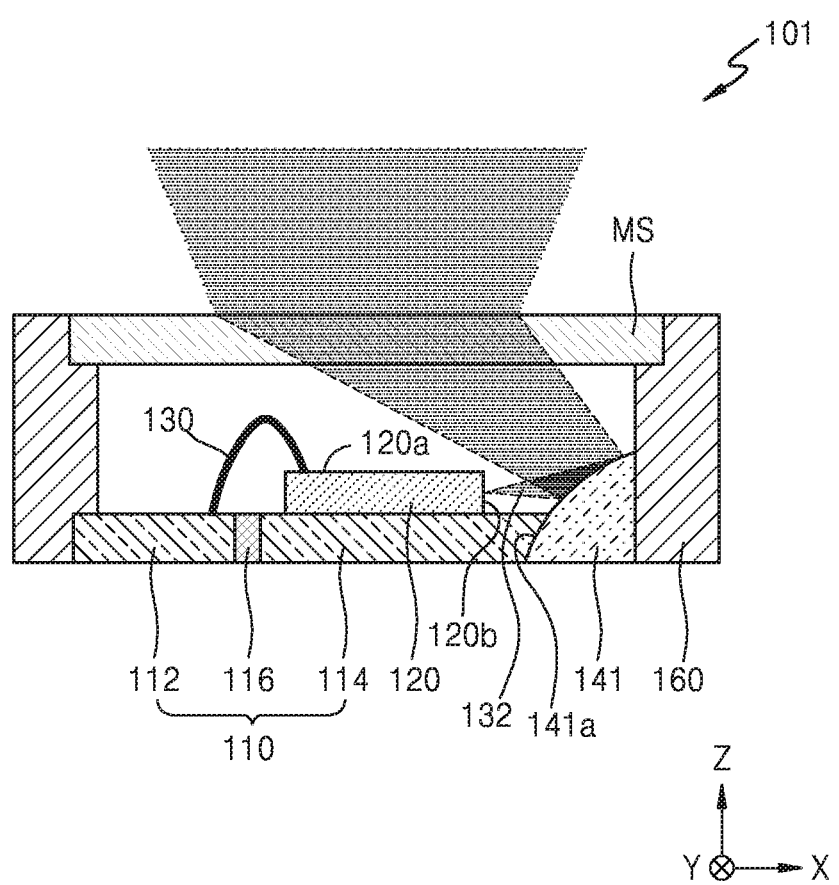
FIG. 10 is a cross-sectional view illustrating a schematic configuration of a meta projector according to some example embodiments.

FIG. 10 is a cross-sectional view schematically illustrating a configuration of a meta projector 101 according to some example embodiments.

In some example embodiments, the meta projector 101 differs from the meta projector 100 illustrated in FIG. 1 in that the shape of a path changing member 141 of the meta projector 101 is different from the shape of the path changing member 140 of the meta projector 100. The path changing member 141 includes a reflective surface 141a configured to bend the propagation path of light 132 by a particular (or, alternatively, predetermined) angle, and the reflective surface 141a may have a shape having a curved surface configured to adjust the divergence angle of incident light. The reflective surface 141a may be mirror-coated. The curved surface of the reflective surface 141a may be spherical or aspherical, and may have a convex shape as shown in FIG. 10 to increase the divergence angle of incident light.

The illustrated shape of the reflective surface 141a is a non-limiting example. For example, the reflective surface 141a may have a concave shape decreasing the divergence angle of incident light, or may have a curved shape varying the diverging direction of incident light according to positions.

Figure 11:
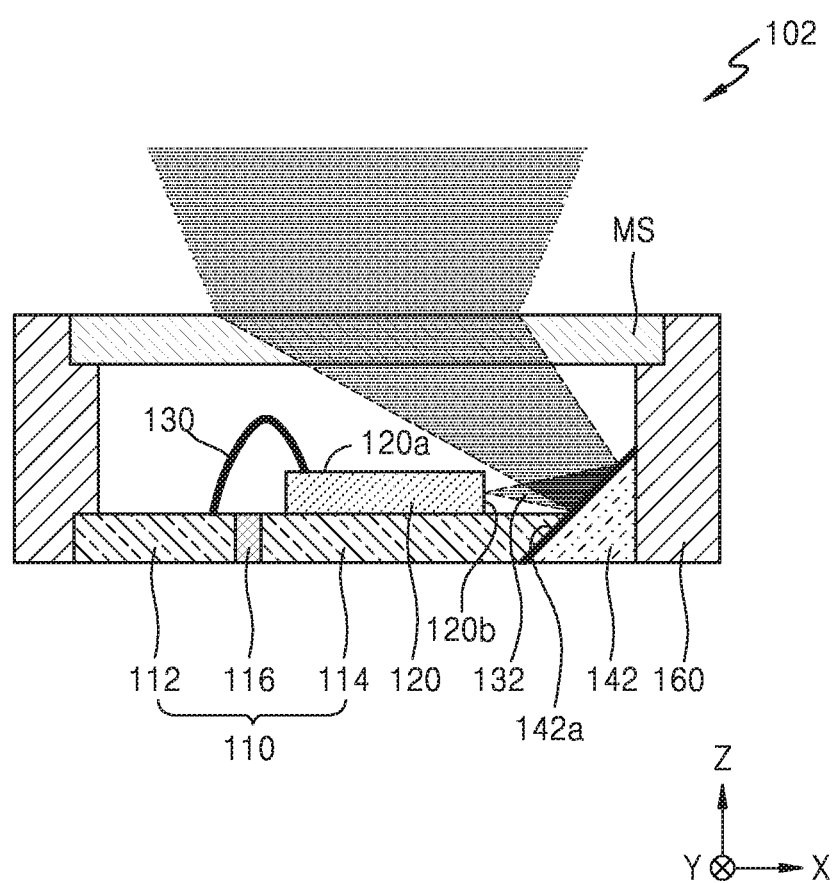
FIG. 11 is a cross-sectional view illustrating a schematic configuration of a meta projector according to some example embodiments.
Figure 12:
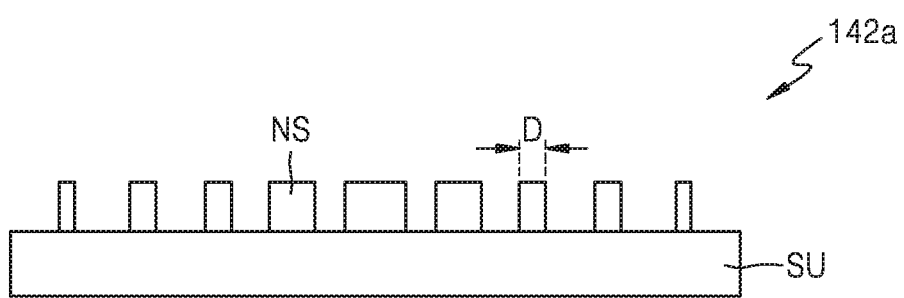
FIG. 12 is a cross-sectional view illustrating an example configuration of a meta-surface of the meta projector of FIG. 11.

FIG. 11 is a cross-sectional view schematically illustrating a configuration of a meta projector 102 according to some example embodiments, and FIG. 12 is a cross-sectional view illustrating an example configuration of a meta-surface 142a of the meta projector 102 illustrated in FIG. 11.

In some example embodiments, the meta projector 102 of the is different from the meta projector 100 illustrated in FIG. 1 in that the meta-surface 142a is a reflective surface of a path changing member 142.

Like a meta-structure layer MS, the meta-surface 142*a* includes a plurality of nanostructures NS having ("associated with") a sub-wavelength shape dimension smaller than the wavelength of light emitted from an edge emitting device 120. That is, the shapes and shape distributions of the nanostructures NS described with reference to FIGS. 3 to 9 may be applied to the meta-surface 142*a*.

The shape distribution of the plurality of nanostructures NS of the meta-surface 142*a* may be associated with the plurality of nanostructures NS being configured to control the divergence angle of incident light 132. For example, as shown in FIG. 12, the shape distribution of the plurality of nanostructures NS may be associated with the plurality of nanostructures NS being configured to perform a function like a convex mirror. The shape distribution of the plurality of nanostructures NS may be so associated such that the widths of the nanostructures NS may gradually decrease in a radial direction from a reference position. This rule may be repeatedly applied to radial directions, and the period of repetition may not be constant. In addition, the shape and transmission phase distribution of the nanostructures NS may be associated with the plurality of nanostructures being configured to perform a function like a convex mirror lens having a cylindrical surface or an ellipsoidal surface.

In some example embodiments, a meta projector may include the meta-surface 142*a* illustrated in FIG. 11 and may include, in place of a meta-structure layer MS including a plurality of nanostructures NS, a layer configured to refract a structured light SL generated by the meta-surface 142*a*. The plurality of nanostructures NS included in the meta-surface 142*a* may have any of the features (e.g., shape distribution) of the plurality of nanostructures NS included in a meta-structure layer MS as described in any of the example embodiments included herein. In some example embodiments, such a layer may be further omitted from the meta projector, such that the meta-surface 142*a* generates a structured light SL pattern based on light 132 being incident thereon, wherein the meta projector is configured to emit the structured light SL generated by the meta-surface 142*a*. A shape distribution of the plurality of nanostructures of the meta-surface 142*a* is associated with forming structured light SL providing a keyboard image in which a set of character keys is arranged or an image including at least one icon.

In view of at least the above, it will be understood that, in some example embodiments, a meta projector that includes the substrate 110 and the edge emitting device 120 further includes a plurality of nanostructures NS configured to receive the light 132 emitted from the edge emitting device 120 and generate a structured light SL pattern based on receiving the light 132 emitted from the edge emitting device, where the plurality of nanostructures NS have a sub-wavelength shape dimension, the sub-wavelength shape dimension smaller than a wavelength of the light emitted from the edge emitting device, and wherein the plurality of nanostructures NS may be included in at least one element of a meta-structure layer MS as described herein and a meta-surface 142*a* as described herein.

Figure 13:
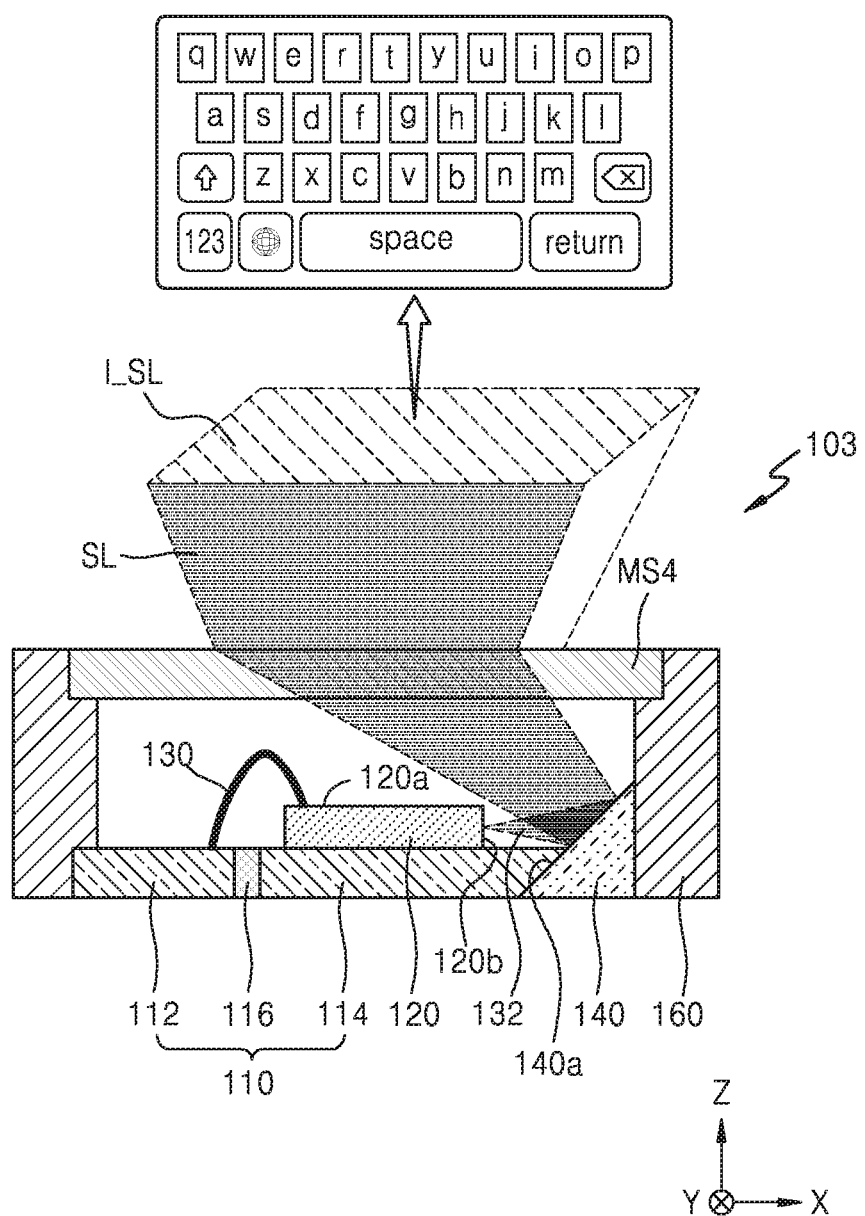
FIG. 13 is a cross-sectional view illustrating a schematic configuration of a meta projector according to some example embodiments.

FIG. 13 is a cross-sectional view schematically illustrating a configuration of a meta projector 103 according to some example embodiments.

In the meta projector 103 according to some example embodiments, details of a meta-structure layer MS4 are determined (e.g., a plurality of nanostructures NS in the meta-structure layer MS4 have a particular shape distribution) such that structured light SL formed by the meta-structure layer MS4 may reproduce a particular (or, alternatively, predetermined) arbitrary shape. For example, as shown in FIG. 13, a structured light image I_SL formed by the meta-structure layer MS4 may be a keyboard image in which a set of character keys is arranged. The structured light image I_SL formed by the meta-structure layer MS4 may be an image including at least one icon. The meta-structure layer MS4 may include a plurality of nanostructures NS having a shape distribution configured to realize such a structured light pattern based on light 132 being incident on the meta-structure layer MS4.

The illustrated structured light image I_SL is an example. For example, the structured light image I_SL may be an image in which one or more icons or pointers are arranged. That is, the shape distribution of the plurality of nanostructures NS of the meta-structure layer MS4 may be such that various images configured to provide an input means as a user interface for a user may be reproduced by the meta projector 103 as structured light images I_SL based on light 132 being incident on meta-structure layer MS4.

Since the above-described meta projectors include meta-structure layers using the shape distribution of nanostructures having a sub-wavelength shape dimension, the above-described meta projectors may have ultra-small sizes. Therefore, the meta projectors may be applied to various electronic apparatuses such as mobile devices or wearable devices. For example, the above-described meta projectors may be used as ultra-small projectors for implementing augmented reality (AR), virtual reality (VR), or mixed reality (MR). In addition, the meta projectors may be used as light sources to form structured light in depth sensors used for accurate three-dimensional shape recognition.

Figure 14:
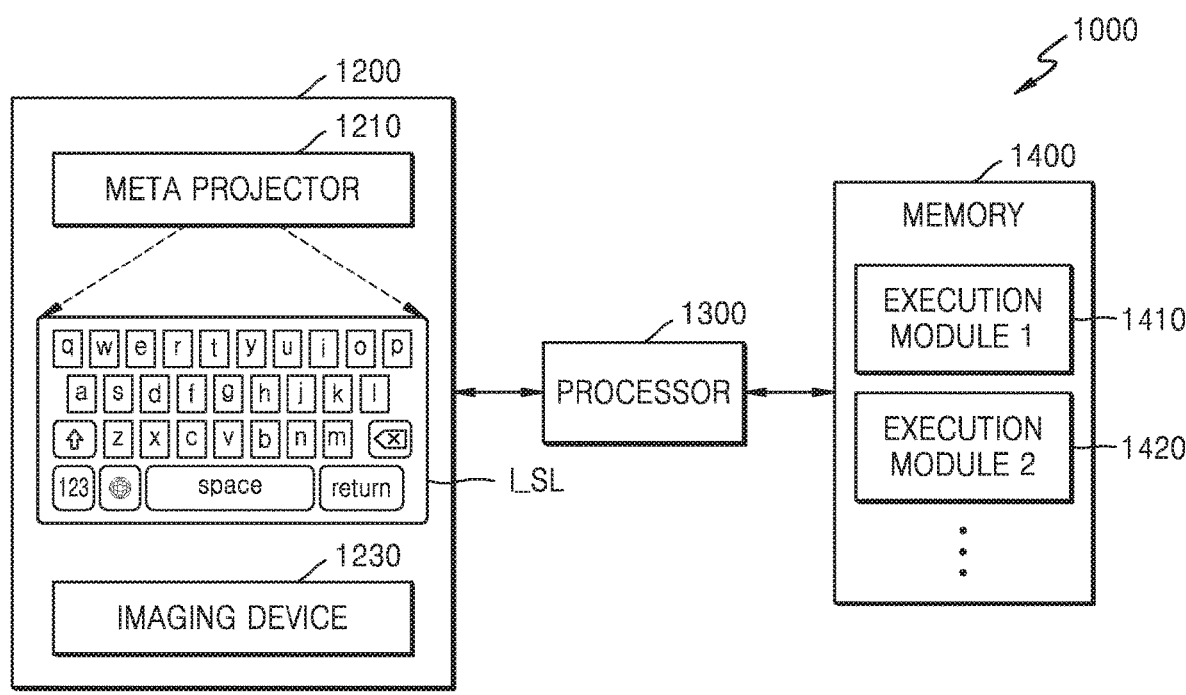
FIG. 14 is a block diagram schematically illustrating a user interface device and an electronic apparatus including the user interface device, according to some example embodiments.

FIG. 14 is a block diagram schematically illustrating a user interface device 1200 and an electronic apparatus 1000 including the user interface device 1200 according to some example embodiments.

The electronic apparatus 1000 includes the user interface device 1200, a processor 1300, and a memory 1400.

The user interface device 1200 includes a meta projector 1210 configured to reproduce a particular (or, alternatively, predetermined) structured light image I_SL and an imaging device 1230 configured to photograph the structured light image I_SL formed by the meta projector 1210.

The structured light image I_SL reproduced by the meta projector 1210 may be a keyboard image in which a set of character keys is arranged as shown in FIG. 14, but is not limited to. For example, the structured light image I_SL may be an image in which one or more icons or pointers are arranged.

A user may express input information using the character keys shown in the structured light image I_SL. That is, a user may perform a desired input operation by touching character keys shown on the keyboard of the structured light image I_SL with his/her fingers.

The imaging device 1230 is placed to photograph the structured light image I_SL. Images taken by the imaging device 1230 may be transmitted to the processor 1300 to extract a user input signal.

The processor 1300 is responsible for all processing and controlling operations of the electronic apparatus 1000. In addition, the processor 1300 may extract a user input signal from images captured by the imaging device 1230 and may execute one of execution modules ("programs of instruction") stored in a memory 1400 according to the extracted user input signal.

The memory 1400 may store one or more execution modules 1410 and 1420 that may be executed by the processor 1300, and data necessary for executing the execution modules 1410 and 1420.

In addition, the memory 1400 may store modules for various applications to be executed by the electronic apparatus 1000, and according to devices included in the electronic apparatus 1000, the memory 1400 may further include modules such as a communication module, a camera module, a video replay module, or an audio replay module.

The memory 1400 may include at least one type of recording medium selected from a flash memory, a hard disk, a micro multimedia card, a memory card (e.g., a secure digital (SD) card or an extreme digital (XD) card, a random access memory (RAM), a static random access memory (SRAM), a read-only memory (ROM), an electrically erasable programmable read-only memory (EEPROM), a programmable read-only memory (PROM), a magnetic memory, a magnetic disk, or an optical disk.

For example, the electronic apparatus 1000 may be a portable mobile communication device, a smart phone, a smart watch, a personal digital assistant (PDA), a laptop, a personal computer (PC), a mobile computing device, or a non-mobile computing device. However, the electronic apparatus 1000 is not limited thereto.

Since the user interface device 1200 including the meta projector 1210 is configured to provide a structured light image I_SL as an input interface, the electronic apparatus 1000 may not include, for example, a real keyboard. Alternatively, the electronic apparatus 1000 may include a real keyboard, and a user may select whether to use the real keyboard or a keyboard provided by a structured light image I_SL.

Figure 15:
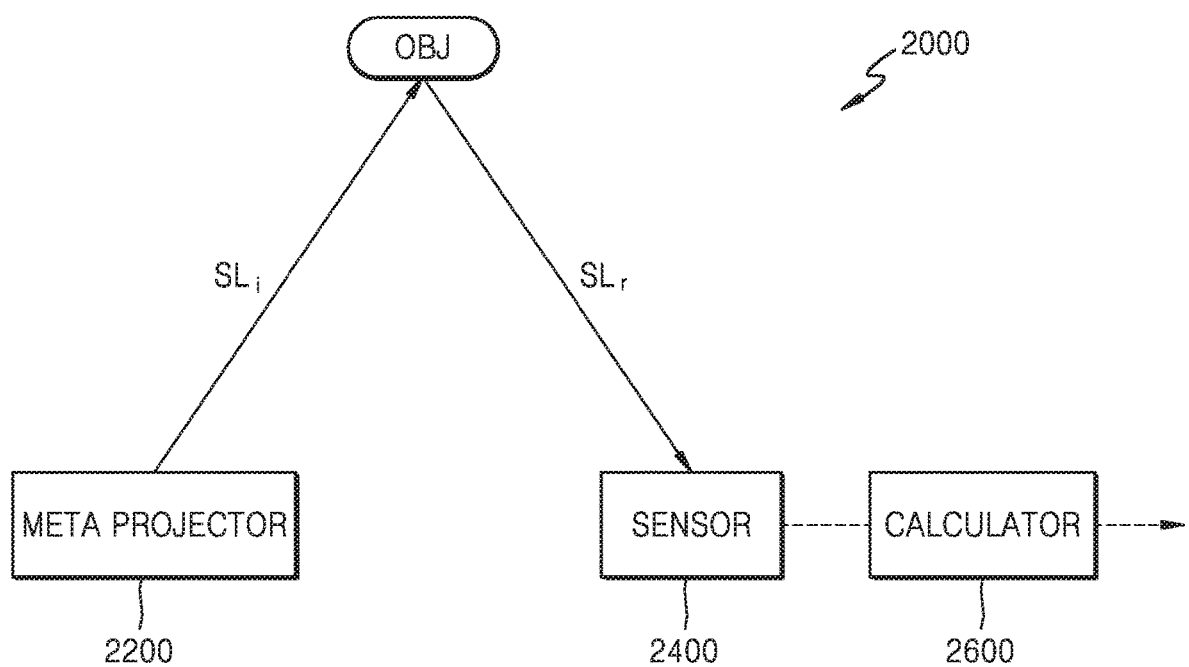
FIG. 15 is a block diagram illustrating a schematic configuration of a depth recognition apparatus according to some example embodiments.

FIG. 15 is a block diagram schematically illustrating a configuration of a depth recognition apparatus 2000 according to some example embodiments.

The depth recognition apparatus 2000 includes a meta projector 2200 configured to emit structured light $SL_i$ toward an object OBJ, a sensor 2400 configured to receiving structured light $SL_r$ reflected from the object OBJ, and a calculator 2600 configured to calculate a depth position of the object OBJ by comparing a pattern change between the structured light $SL_i$ emitted from the meta projector 2200 and the structured light $SL_r$ received by the sensor 2400.

The meta projector 2200 may convert light (e.g., light 132) emitted from an edge emitting device into structured light (e.g., structured light SL) having a particular (or, alternatively, predetermined) pattern and may output the structured light. The meta projector 2200 may include any one of the meta projectors 100, 101, and 102 of the above-described embodiments or a combination thereof.

The sensor 2400 senses the structured light $SL_r$ reflected from the object OBJ. The sensor 2400 may include an array of light detecting elements. The sensor 2400 may further include a spectroscopic element to analyze light reflected from the object OBJ according to wavelengths.

The calculator 2600 may compare the structured light $SL_i$ emitted toward the object OBJ with the structured light $SL_r$ reflected from the object OBJ so as to obtain depth information on the object OBJ and may analyze the three-dimensional shape, position, motion, or the like, of the object OBJ based on the depth information. The structured light $SL_i$ generated by the meta projector 2200 is a pattern mathematically coded so as to uniquely designate angular position coordinates using bright and dark points. When such a pattern strikes the object OBJ having a three-dimensional shape and is then reflected from the object OBJ, the pattern of reflected structured light $SL_r$ is different from the pattern of incident structured light $SL_i$. Depth information on the object OBJ may be extracted by comparing such patterns and tracing patterns according to coordinates, and in this manner, three-dimensional information on the shape and motion of the object OBJ may be extracted.

Additional optical elements may be arranged between the meta projector 2200 and the object OBJ so as to adjust the direction of structured light $SL_i$ emitted from the meta projector 2200 toward the object OBJ or additionally modulate the structured light $SL_i$.

In addition, the depth recognition apparatus 2000 may further include: a controller configured to generally control the operation of a light source of the meta projector 2200 or the operation of the sensor 2400; and a memory storing a calculation program to be used when the calculator 2600 performs three-dimensional information extraction.

Results of calculation of the calculator 2600, that is, information about the shape and position of the object OBJ may be transmitted to another unit. For example, such information may be transmitted to a controller of an electronic apparatus including the depth recognition apparatus 2000. A unit to which results of calculation are transmitted may be a display device or a printer configured to output the results. In some example embodiments, the unit may be a smartphone, a cellular phone, a personal digital assistant (PDA), a laptop, a personal computer (PC), a wearable device, a mobile device, or a non-mobile computing device. However, the other unit is not limited to the listed devices.

The depth recognition apparatus 2000 may be used as a sensor configured to precisely acquiring three-dimensional information on a front object and thus may be applied to various electronic apparatuses. Examples of such various electronic apparatuses may include: an autonomous drive apparatus such as an unmanned vehicle, an autonomous drive vehicle, an autonomous drive robot, or an autonomous drive drone; a mobile communication apparatus; and an Internet of Things (IoT) apparatus.

In the above-described meta projectors, light emitted from an edge emitting device may be converted into structured light having various patterns by a meta-structure layer having sub-wavelength nanostructures.

The above-described meta projectors may be easily implemented as integrated modules having ultra-small sizes.

The above-described meta projectors may be applied to various electronic apparatuses. For example, the above-described meta projectors may be applied to depth recognition apparatuses for precise motion sensing and three-dimensional shape sensing.

The operations described in the embodiments are examples which are not intended to limit the scope of the inventive concepts. In the present disclosure, descriptions of known electric components, control systems, software, and other functional aspects thereof may not be given for conciseness. Furthermore, in the drawings, connection lines or members between elements are functional, physical, and/or electric connections illustrated as examples that can be replaced with or used together with other functional, physical, and/or electrical connections.

Example embodiments have been described and illustrated with reference to the accompanying drawings to help understanding of the inventive concepts. However, these embodiments are merely example not limiting the scope of the inventive concepts. In addition, it will be understood that the inventive concepts is not limited to those illustrated and described in the present disclosure. That is, those of ordinary skill in the art may make various modifications therefrom.

It should be understood that embodiments described herein should be considered in a descriptive sense only and not for purposes of limitation. Descriptions of features or aspects within some example embodiments should typically be considered as available for other similar features or aspects in other example embodiments.

While one or more example embodiments have been described with reference to the figures, it will be understood by those of ordinary skill in the art that various changes in form and details may be made therein without departing from the spirit and scope as defined by the following claims.

What is claimed is:

1. A meta projector comprising:
a substrate;
an edge emitting device on the substrate, the edge emitting device including an upper surface extending parallel to the substrate and a side surface inclined relative to the upper surface, the edge emitting device configured to emit light through the side surface;
a meta-structure layer spaced apart from the upper surface of the edge emitting device, the meta-structure layer including a plurality of nanostructures having a sub-wavelength shape dimension, the sub-wavelength shape dimension smaller than a wavelength of the light emitted from the edge emitting device; and
a path changing member configured to change a path of the light emitted from the edge emitting device to direct the path toward the meta-structure layer,
wherein a shape distribution of the plurality of nanostructures is configured to form structured light using the light emitted from the edge emitting device, and a pattern of the structured light is mathematically coded to uniquely designate angular position coordinates using bright and dark points, and
wherein the plurality of nanostructures includes a plurality of groups of nanostructures, and the plurality of groups of nanostructures are arranged at a predetermined period for a transmission phase distribution to adjust direction along which the structured light is output.

2. The meta projector of claim 1, further comprising:
a housing fixing the substrate, the meta-structure layer, and the path changing member, such that the meta projector is an integrated module.

3. The meta projector of claim 1, wherein the substrate includes
a cathode and an anode respectively connected to two electrodes of the edge emitting device; and
an insulating layer electrically isolating the cathode and the anode from each other.

4. The meta projector of claim 1, wherein the plurality of nanostructures include a material having a refractive index higher than a refractive index of a separate material adjacent to the plurality of nanostructures.

5. The meta projector of claim 1, wherein the plurality of nanostructures include a conductive material.

6. The meta projector of claim 1, wherein the shape distribution of the plurality of nanostructures is a regular distribution or a random distribution.

7. The meta projector of claim 1, wherein the shape distribution of the plurality of nanostructures is associated with different transmission phase distributions based on polarization of incident light.

8. The meta projector of claim 1, wherein shapes of cross-sections of the plurality of nanostructures parallel to the upper surface of the edge emitting device have asymmetry.

9. The meta projector of claim 1, wherein the plurality of nanostructures are associated with an arrangement pitch which is equal to or less than one-half of the wavelength of the light emitted from the edge emitting device.

10. The meta projector of claim 1, wherein
the meta-structure layer further includes a support layer supporting the plurality of nanostructures, and
the plurality of nanostructures includes separate pluralities of nanostructures on opposite, respective sides of the support layer.

11. A depth recognition apparatus comprising:
the meta projector of claim 1 configured to emit structured light toward an object;
a sensor configured to receive the structured light reflected from the object; and
a calculator configured to compare a pattern of the structured light emitted toward the object and a pattern of the structured light reflected from the object, and calculate a depth position of the object.

12. A meta projector comprising:
a substrate;
an edge emitting device on the substrate, the edge emitting device including an upper surface extending parallel to the substrate and a side surface inclined relative to the upper surface, the edge emitting device configured to emit light through the side surface;
a meta-structure layer spaced apart from the upper surface of the edge emitting device, the meta-structure layer including a plurality of nanostructures having a sub-wavelength shape dimension, the sub-wavelength shape dimension smaller than a wavelength of the light emitted from the edge emitting device; and
a path changing member configured to change a path of the light emitted from the edge emitting device to direct the path toward the meta-structure layer,
wherein the meta-structure layer further includes a support layer supporting the plurality of nanostructures,
wherein the plurality of nanostructures includes separate pluralities of nanostructures on opposite, respective sides of the support layer, and
wherein one plurality of nanostructures on one side of the opposite, respective sides of the support layer where the light emitted from the edge emitting device first arrives are associated with a shape distribution associated with a transmission phase distribution that increases a divergence angle of incident light.

13. A meta projector comprising:
a substrate;
an edge emitting device on the substrate, the edge emitting device including an upper surface extending parallel to the substrate and a side surface inclined relative to the upper surface, the edge emitting device configured to emit light through the side surface;
a meta-structure layer spaced apart from the upper surface of the edge emitting device, the meta-structure layer including a plurality of nanostructures having a sub-wavelength shape dimension, the sub-wavelength shape dimension smaller than a wavelength of the light emitted from the edge emitting device; and
a path changing member configured to change a path of the light emitted from the edge emitting device to direct the path toward the meta-structure layer,
wherein the path changing member includes a reflective surface including a meta-surface, the meta-surface including the plurality of nanostructures, and wherein a shape distribution of the plurality of nanostructures of the meta-surface is configured to adjust a divergence angle of incident light.

14. The meta projector of claim 13, wherein the reflective surface includes a curved surface.

* * * * *